United States Patent [19]
Schmitz et al.

[11] Patent Number: 5,272,112
[45] Date of Patent: Dec. 21, 1993

[54] LOW-TEMPERATURE LOW-STRESS BLANKET TUNGSTEN FILM

[75] Inventors: Johannes J. Schmitz, Sunnyvale; Sien G. Kang, Tracy; Edward J. Rode, San Ramon, all of Calif.

[73] Assignee: Genus, Inc., Sunnyvale, Calif.

[21] Appl. No.: 973,841

[22] Filed: Nov. 9, 1992

[51] Int. Cl.$^5$ ............................................. H01L 21/44
[52] U.S. Cl. ................................... 437/192; 437/189; 437/190
[58] Field of Search ........................ 437/192, 189, 190

[56] References Cited

U.S. PATENT DOCUMENTS

| | | | |
|---|---|---|---|
| 5,028,565 | 7/1991 | Chang et al. | 437/192 |
| 5,108,952 | 4/1992 | Matsuhashi | 437/192 |
| 5,202,287 | 4/1993 | Joshi et al. | 437/192 |

Primary Examiner—Olik Chaudhuri
Assistant Examiner—C. Everhart
Attorney, Agent, or Firm—Donald R. Boys

[57] ABSTRACT

A chemical vapor deposition process performed at a temperature below 440 degrees C. for blanket tungsten deposition as a step in manufacturing integrated circuits deposits an integrated film suitable for voidless fill of vias as small as 0.5 microns in width and with aspect ratios of more than 2, while providing resistivity well below 100 micro-ohms per square, film stress generally in the mid 7E+09 dynes per square centimeter and below, and reflectivity of more than 40%, measured relative to silicon at 436 nanometer wavelength for 1 micron film thickness, while avoiding the use of nitrogen in the process.

10 Claims, 8 Drawing Sheets

Fig. 1

Run Date 2/20/92    Process Recipe LS3SF    Run #694

| Wafer | Thickness Å | Rs μΩ/Sq | Uniformity % | Stress Dynes/cm$^2$ |
|---|---|---|---|---|
| 1 | 10328 | 86.86 | 2.26 | 7.5E+9 |
| 2 | 10178 | 88.76 | 2.62 | 7.4E+9 |
| 3 | 10813 | 83.40 | 1.76 | 7.6E+9 |
| 4 | 10083 | 92.14 | 2.92 | 7.7E+9 |
| 5 | 10404 | 87.41 | 1.50 | 7.6E+9 |
| 6 | 10014 | 92.70 | 2.52 | 7.8E+9 |

Fig. 2

Low Temperature, Low Stress Blanket Tungsten Film

S/N 144 Star System

| Process Step | Recipe | Chuck #1 | Chuck #2 | Chuck #3 | Chuck #4 | Chuck #5 | Chuck #6 |
|---|---|---|---|---|---|---|---|
| 1+2+3 | LS3SF | 7.62 | 7.52 | 7.62 | 7.76 | 7.36 | 7.62 |
| 1 | NUCLA | 17.60 | 16.69 | 14.61 | 15.08 | 14.47 | 14.95 |
| 2 | LS1SC | 11.16 | 11.38 | 11.16 | 10.46 | 10.93 | 11.32 |
| 3 | LS1SB | 2.26 | 2.33 | 1.82 | 2.87 | 1.90 | 2.90 |
| 1+2+3 | LS3SF | 2.49 | 2.98 | 1.50 | 2.24 | 1.93 | 2.72 |
| 1 | NUCLA | 5.68 | 2.60 | 5.04 | 3.49 | 6.08 | 3.04 |
| 2 | LS1SC | 4.02 | 3.94 | 4.00 | 5.36 | 3.25 | 5.32 |
| 3 | LS1SB | 7.47 | 10.74 | 8.96 | 6.71 | 7.24 | 7.20 |
| 1+2+3 | LS3SF | 10446 | 10848 | 10874 | 10806 | 10209 | 10748 |
| 1 | NUCLA | 910 | 1166 | 1094 | 1288 | 1063 | 1315 |
| 2 | LS1SC | 5758 | 5720 | 5926 | 5192 | 5850 | 5318 |
| 3 | LS1SB | 3666 | 4034 | 3751 | 4355 | 3648 | 4144 |

(1) Tungsten film stress expressed as E+09 dynes per square centimeter (2) Tungsten film uniformity, percent (3) Tungsten film thickness in Angstrom units

Fig. 3

Process I.D.: LS3SF
Engineer: SK (S/N 144)
Date Last Modified: 6/30/92

| Step Recipe: | NUCLA | LS1SC | LS1SB |
|---|---|---|---|
| Time | 30 | 125 | 215 |
| Temp | 400 | 400 | 400 |
| Press | 30 | 30 | 30 |
| Gas Flows: | | | |
| Argon | 166 | 166 | 2627 |
| Hydrogen | 2803 | 4783 | 5733 |
| Silane | 147 | — | — |
| Tungsten Hex. | 294 | 222 | 38 |

Legend:
Time: = Seconds
Temp: = deg C
Press: = Torr
Power: = Watts
Gas flows: = sccm Note: Showerheads are extended to 2.5 cm from wafer system

Fig. 4

Process I.D.: LS3SJ
Engineer: SK (S/N 144)
Date Last Modified: 6/30/92

| Step Recipe: | NUCLA | ALT1 | LS1SB |
|---|---|---|---|
| Time | 30 | 125 | 215 |
| Temp | 400 | 400 | 400 |
| Press | .30 | 30 | 30 |
| Gas Flows: | | | |
| Argon | 166 | 166 | 2627 |
| Hydrogen | 2803 | 4783 | 5733 |
| Silane | 147 | — | — |
| Tungsten Hex. | 294 | 130 | 38 |

Legend:
Time: = Seconds
Temp: = deg C
Press: = Torr
Power: = Watts
Gas flows: = sccm Note: Showerheads are extended to 2.5 cm from wafer surface

Fig. 5

Process I.D.: LS1SH Low Stress sub-process
Engineer: SK (S/N 144)
Date Last Modified: 6/30/92

Step Recipe:

| | |
|---|---|
| Time | 215 |
| Temp | 400 |
| Press | 90 |
| Gas Flows: | |
| Argon | 2627 |
| Hydrogen | 14683 |
| Silane | — |
| Tungsten Hex. | 38 |

Note: Showerheads at 2.5 cm from wafer surface

Legend:
Time: = Seconds
Temp: = deg C
Press: = Torr
Power: = Watts
Gas flows: = sccm

Fig. 6

Process I.D.: LS3SC
Engineer: SK (S/N 144)
Date Last Modified: 6/30/92

| Step Recipe: | NUCLA | ALT2 | ALT3 |
|---|---|---|---|
| Time | 30 | 125 | 535 |
| Temp | 400 | 400 | 400 |
| Press | 30 | 30 | 30 |
| Gas Flows: | | | |
| Argon | 166 | 166 | 6974 |
| Hydrogen | 2803 | 4783 | 9622 |
| Silane | 147 | — | |
| Tungsten Hex. | 294 | 294 | 17 |

Note: Showerheads extended to a distance of 2.5 cm from wafer surface.

Legend:
Time: = Seconds
Temp: = deg C
Press: = Torr
Power: = Watts
Gas flows: = sccm

Fig. 7

Process I.D.: LS3SC
Engineer: SK (S/N 144)
Date Last Modified: 6/30/92

| Step Recipe: | NUCLA | ALT4 | ALT5 |
|---|---|---|---|
| Time | 30 | 130 | 420 |
| Temp | 400 | 400 | 400 |
| Press | 30 | 30 | 30 |
| Gas Flows: | | | |
| Argon | 166 | 166 | 6974 |
| Hydrogen | 2803 | 6565 | 9622 |
| Silane | 147 | — | |
| Tungsten Hex. | 294 | 390 | 17 |

Legend:
- Time: = Seconds
- Temp: = deg C
- Press: = Torr
- Power: = Watts
- Gas flows: = sccm Note: Showerheads extended for only low-stress step (ALT5)

Fig. 8

LOW-TEMPERATURE LOW-STRESS BLANKET TUNGSTEN FILM

FIELD OF THE INVENTION

The present invention is in the area of methods and apparatus for processing wafers as a manufacturing step in manufacturing integrated circuits, and relates in particular to chemical vapor deposition (CVD) deposition of tungsten to accomplish via fill and interconnect films.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. CVD is a well known process for depositing such thin films and layers. For example, polysilicon may be deposited from silane gas, $SiH_4$. It is known, too, to deposit tungsten silicide from a mixture of gases including silane and a tungsten-bearing gas such as tungsten hexafluoride. Pure tungsten is also deposited on silicon wafers in the manufacture of integrated circuits, sometimes selectively and sometimes across the entire surface in a process known as "blanket" tungsten.

In a typical CVD process such as blanket tungsten, wafers are placed on supports within a sealable chamber, the chamber is sealed and evacuated, the wafers are heated, typically by heating the wafer support, and a gas mixture is introduced into the chamber. For example, in the blanket tungsten process, tungsten hexafluoride and hydrogen are introduced as reactive gases, and typically argon is introduced as a non-reactive carrier gas. The tungsten hexafluoride is the source of deposited tungsten. Typically the gases are flowed continuously during process. The temperature of a substrate (wafer) to be coated is one of the variables that drives the chemical reaction to cause tungsten to be deposited on the substrate surface. It is important to control the temperature, the concentration of various gases in the mixture introduced, and such characteristics as the uniformity of flow of gas over the surface being coated, among other variables.

In the practice of CVD deposition of tungsten on wafers in the manufacture of integrated circuits, it is common for the silicon substrate to have portions of an integrated circuit already formed thereon, and in a typical application, an insulating layer of silicon oxide has been formed over transistor devices formed on the wafer and patterned to provide contact openings or vias giving access to underlying structures. Tungsten deposition in this case has two related purposes: one is to fill the vias to provide electrical contact to lower levels, and the other is to provide a thin metal film to be subsequently patterned and etched to provide electrically connecting traces between devices on the wafer, providing thereby the integrated circuit.

In recent years a number of studies have been carried out and published on high throughput blanket tungsten CVD processes for contact/via fill applications, including "plugs", and also on interconnect applications. An example is a paper "Workshop on Tungsten and Other Advanced Metals for VLSI/ULSI Applications V", by R. V. Joshi, E. Mether, M. Chow, M. Ishaq, S. Kang, P. Geraghty, and J. McInerney; edited by S. S. Wong and S. Furukawa, published in *Materials Research Society*, pp. 157 (1990), incorporated herein by reference. For the purpose of this section, the two types of applications of blanket tungsten process will be termed "plug" and "interconnect".

Experience to the present time, including the study above and other studies, indicate that the two basis applications for blanket tungsten have considerably different requirements in terms of film characteristics. For example, low stress films are known to be quite important for interconnect applications, but stress is not as critical for plug applications. Similarly, high reflectivity is desirable for interconnect processes, but not as critical for plug processes. Low resistivity is more important for interconnect processes than for plug processes. Finally good step coverage is important in both types of processes.

Given the relative importance of different film characteristics as listed above, it is known also that film characteristics vary in some generally known ways depending on process parameters such as wafer temperature, total process pressure, and Nitrogen flow rate. For example, studies and experience show that low stress films are promoted by relatively higher wafer temperature during deposition and by low process pressure, generally under 1 Torr. As a baseline, a stress level of $7 \times 10^9$ dynes/cm$^2$ is a desirable goal, and in the experience and knowledge of the present inventors, requires deposition temperature well above 480° C. There are processes, however, wherein the devices and materials already formed on a wafer to be coated by tungsten, may be adversely susceptible to high temperature. In most cases this threshold is about 440 degrees C.

Reflectivity is promoted generally by a low flow rate of $WF_6$, low deposition temperature (400° C.), high process pressure (100 Torr), and a high flow rate of nitrogen in the process gas. Reflectivity of 40% and greater is desirable in subsequent photolithography processes, measured relative to silicon at 436 nanometer wavelength for 1 micron film thickness.

Low resistivity (less than 9 micro-ohm-cm) is enhanced by high deposition temperature and little or no nitrogen in the process.

Maximum step coverage effect is promoted by a high flow rate of $WF_6$, low wafer temperature, and medium to high process pressure.

Because of the different requirements for film characteristics and the dependence on process parameters, generally two types of processes have been developed. One type for plug processes, with relatively high film stress, superior step coverage, using moderate temperature, and the other for interconnect applications, with low stress film having high reflectivity and providing moderate step coverage, performed at higher temperature.

Experience has shown that even the optimization of process for each application still leaves problems. For example, in interconnect processes, the effort to decrease film stress leads to reduced step coverage and difficulty with small contact areas such as 0.5 microns and below. Moreover, there has been evidence that high wafer temperature may cause junction leakage, as specified by T. Kaelyama, Y. Imamura, and K. Hamamoto in "The Proceedings of the 8th Symposium on Ion Beam Technology", 1989, pp141, at Hossei University in Tokyo, Japan. There are similarly other difficulties not covered in this brief description of the background.

What is clearly needed is a blanket tungsten process at low temperature, below 440° C., and preferably as low as 400° C., which is suitable for both interconnect and via fill, or "plug" applications. In such a "universal" process, it would be desirable to have an efficient use of $WF_6$ reactant, the expensive source of tungsten. It would be desirable, too, if the process could be accomplished with adequate reflectivity but without the use of nitrogen gas, as nitrogen is known to promote poor film adhesion in some instances, particularly in reactor walls and parts which increases particulate problems, and also to increase resistivity of film intended for interconnects.

SUMMARY OF THE INVENTION

In a preferred embodiment of the present invention a method is provided for depositing a blanket integrated film of tungsten by CVD from $WF_6$ reduced by $H_2$ on a surface to be coated of a semiconductor wafer. The method comprises forming a first portion of the integrated film under conditions conducive to voidless via fill to fill any vias on the surface to be coated. The first portion is deposited at a wafer temperature not exceeding 440° C., a total pressure of from about 20 to about 100 Torr, and with a $WF_6$ flow of at least 0.15 sccm per square centimeter of wafer surface to be coated. A second portion of the integrated film is formed under conditions conducive to a low film stress. The second portion is deposited at a wafer temperature not exceeding 440° C., a total pressure of from about 20 to about 100 Torr, and at a $WF_6$ flow from about 0.0125 to about 0.05 sccm per square centimeter of wafer surface to be coated. Coating gases are injected over the wafer surface through a gas distribution device at a distance no greater than about 3.8 centimeters.

The method of the present invention may be practiced in the absence of any flow of nitrogen gas, thereby avoiding problems attendant to nitrogen in a CVD process, while maintaining reflectivity of at least 40%, measured relative to silicon at 436 nanometer wavelength for 1 micron film thickness. In preferred embodiments the integrated film is applied to a total thickness of at least 0.8 micron, and at least one-half of the thickness is applied under deposition conditions for the first portion. In some embodiments the thickness of the first portion is up to about 60% of the total thickness.

In many embodiments it is convenient and expedient to precede the first portion of the film as described herein by a nucleation step depositing from about 400 to about 1000 Å of tungsten deposited quickly, at low pressure, such as below 1 Torr, and with $SiH_4$ introduced as a reducing agent.

It has been found in establishing the process of the invention that a constant wafer temperature of about 400° C. is preferred in the overall process, and a total pressure of about 30 Torr is preferable during the deposition of the first portion (a high-step-coverage portion) and the second portion (a low-stress portion). The pressure of 30 Torr does not apply when depositing a nucleation layer, which is deposited at much lower pressure, such as 0.3 Torr.

The invention provides for the first time in the art a means of depositing a film suitable both for plug and via-fill applications as well as for interconnect applications, without altering process conditions; and without a need for nitrogen in any step of the process.

DESCRIPTION OF THE PREFERRED EMBODIMENTS

In contemplating the desirability of a single and universal process for both plug and interconnect applications, the inventors theorized that the goal might be achieved by a multi-step process, wherein a portion of a layer of tungsten would be deposited under one set of process conditions, and at least one other portion would be deposited at another set of process conditions. As it is known to the inventors to use a nucleation step prior to the bulk of the deposition, the two steps alluded to in theory above are meant in addition to any nucleation step.

The inventors believed that because of the intimacy of the material deposited, the fact that the material is the same material even though process parameters differ, and the fact that the two steps in a addition to nucleation could be performed one after the other, with no significant time delay, and no exposure of the developing film to contaminants or oxidation, the resulting thin film (typically about 1 micron in thickness) would in effect form a single layer with film characteristics derived from both sets of process conditions used to perform the separate steps.

As a part of the planning it was also taken into account that some process parameters may be varied (or reset at a different stable condition) rather readily, such as a magnitude of gas flow, and some can be varied only slowly, such as deposition temperature, which is slow to respond because of thermal mass of system components. As a result the inventors intended from the first to provide the different portions of the integral layer at a single temperature. Also, because relatively low temperature is generally desired to avoid damage to existing circuit components, it was decided to operate at relatively low wafer temperature for the different portions of the film, such as at about 400° C.

There are known to the inventors several manufacturers of CVD equipment wherein a process of the nature of the present invention might be performed. As noted in the above background section, it is required to evacuate a chamber, transfer wafers to and from the chamber, support the wafers during process, heat the wafers, and to supply process gases proximate the wafer surface to be coated. The process of the present invention may be practiced, therefore, in a wide variety of CVD equipment made and sold by a number of different manufacturers.

In establishing the present invention, a "batch" type system 11 (FIG. 1) was used. This system is a Genus Model 8720 STAR system developed especially for blanket tungsten processes, and is similar in many respects to the Genus Model 8700 system. The 8720 STAR system has retractable "showerheads" for distributing process gases at each wafer surface.

Figure 1:
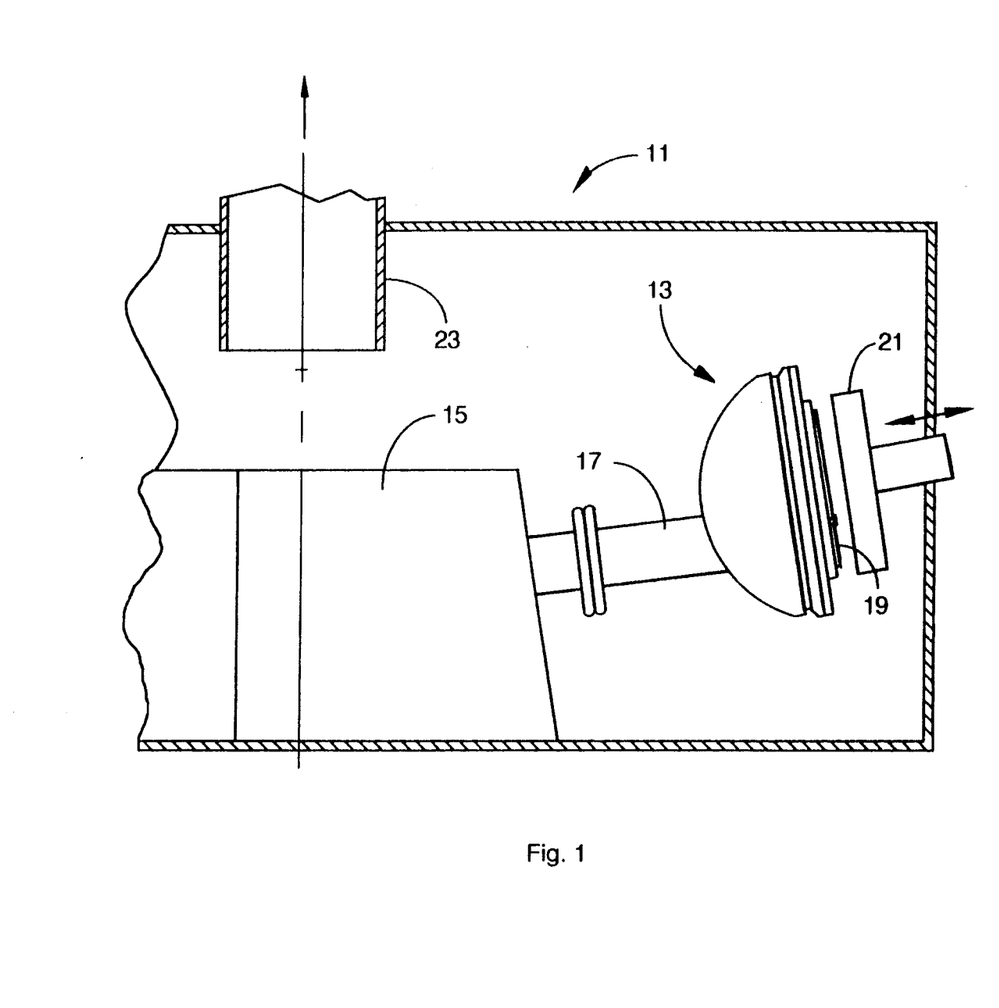
FIG. 1 is an elevation view of a portion of a CVD apparatus as used in establishing the method of the present invention.

The feature of retractability allows showerheads to be retracted during some process steps, and advanced to relatively close proximity of the wafer surface to be coated during other process steps.

The 8720 STAR system has six CVD chucks arranged around a central turret. The system is loadlocked and wafers are handled robotically into and out of the process chamber of the system between batch processes. In establishing the invention nominal six-inch (150 mm) diameter wafers were used, and gas flows specified are therefor for 6-inch wafers. Gas flows in preferred embodiments may, in general, be scaled up and down for different size wafers according to wafer surface area, which varies as the square of the diameter. The gas flow required, then, for a 200 mm dia. wafer will, in general, by 1.78 times that needed for a 150 mm wafer.

FIG. 1 is a somewhat schematic side elevation view of one chuck 13 in system 11 and connection to a central turret 15. Chuck 13 has an associated heater for bringing a wafer to be processed to a suitable temperature for CVD deposition, and electrical connections to the heater are made through a vacuum-tight conduit 17 leading to the central turret from the chuck. A wafer, such as wafer 19, is supported on the CVD chuck for processing, and a "showerhead" device 21 is utilized to inject a process gas mixture proximate the wafer surface to be coated. In the system shown the showerhead is adjustable for distance from the wafer from outside the system. The CVD chamber is vacuum pumped through a pumping port 23, centrally located over the central turret.

The process gases and their flow rates and pressures, and wafer temperatures for processing according to preferred embodiments of the invention are indicated hereinafter.

In describing the present invention a "step" in a process means a process portion conducted at a particular set of process conditions; for example, gas presence and flows, wafer temperature, time, position of a showerhead, process gas pressure in the reaction chamber, and so on. It is known to the inventors to process while altering the value of one or more process variables, but such dynamic processing is difficult to control and repeat, as it adds new dimensions to process control.

Typically, each step is performed under stable process conditions, and an effort is made to maintain the constancy of variables during a process step. Such is the case in the present invention, although one might alter variables dynamically in transition from one step to another, without departing from the spirit and scope of the invention.

To clarify matters still further relative to steps, it is common in CVD processes to alter variables one-at-a-time for simplicity's sake. That is, there are typically deposition steps and transition steps. Typically in a CVD process there is a carrier gas, such as argon, a reducing agent, such as Silane or Hydrogen, and the gas that supplies the material of the desired coating. In this case the material is supplied by tungsten hexafluoride, $WF_6$. If the flow of carrier gas or reducing gas is to change between deposition steps, the $WF_6$ is stopped and the other gas flows are changed one-at-a-time in transition steps, then the $WF_6$ flow is re-established for the next deposition step. This transition is a convenience for purposes of the invention, not a requirement.

In the preferred embodiment the invention is a three-deposition-step process, including a nucleation step, wherein all three deposition steps are performed at about 400° C. The chuck temperature is kept constant throughout the process.

The first deposition step is an optional nucleation step wherein $WF_6$ is reduced by Silane ($SiH_4$) and hydrogen at a low process pressure with the temperature at about 400° C. The low pressure, in the preferred embodiment 300 milliTorr, helps to prevent gas phase nucleation, which can cause particle problems. This first step provides an initial layer of about 400 to about 1000 Angstrom units thickness contributing to the eventual about 1 micron total film thickness. The thickness for the nucleation step can be less than 400 and more than 1000 Angstroms. For the six-chuck Model 8720 STAR system used establishing the process of the invention, the total gas flows in the preferred embodiment for the nucleation deposition step are:

Argon: 166 sccm
Hydrogen: 2803 sccm
Silane: 147 sccm
$WF_6$: 294 sccm

The showerhead gas distributors for each chuck in this nucleation step are preferably extended to about 1 inch from the wafer surfaces, although the nucleation step may also be performed with the showerheads retracted without significant deviation in gas flow.

Under these conditions in the Model 8720 STAR system, the time for the nucleation step is about 20 seconds.

Preparatory to the nucleation step the chamber is evacuated and purged with argon, then the flows of the gases other than $WF_6$ are established. Again, these transition steps are not required, but are convenient.

In a second deposition step, Silane is eliminated and the flow of hydrogen is increased. The process pressure is increased to a pressure in the range of 30 Torr to 100 Torr, preferably 30 Torr, and $WF_6$ is set at a somewhat reduced flow compared to the nucleation deposition step.

This second step is a "high step coverage" step established particularly to provide excellent results for "plugs" and "via fills". The wafer temperature is maintained at 400° C. The goal for the complete integrated universal film in three deposition steps is about 1μ (10,000 Å), although this parameter varies somewhat according to application, generally from about 0.8 micron to about 1.2 micron. The nucleation step, as described above, provides less than about 10% or less of this total. The additional thickness required is, in the preferred embodiment, divided about 60% for the "high step coverage" step, and 40% for the third deposition step, described below, which is a "low stress" step. This may vary in other embodiments, but it was found that it is preferable to deposit at least 50% of the overall film thickness in the mode that provides for high step coverage.

According to the above then, the thickness for the second deposition step is about 5400 Å, and for the third deposition step, about 3600 Å. In practicing the invention, the thickness contribution of each step can be adjusted by time.

The gas flows in the second deposition step for a 6-inch wafer are about:
Argon: 166 sccm
Hydrogen: 4783 sccm
$WF_6$: 222 sccm In this second deposition step the showerhead distribution devices are extended to a position about 1 inch from the wafer surface to be coated, although this second, or high-step-coverage step may also be performed with the showerhead devices retracted. If the showerheads are retracted, then the $WF_6$ flow must be increased to about 1.75 to 2.0 times the flow with the showerheads extended. It is preferable to leave the showerheads extended.

Under these conditions for the thickness indicated in the Model 8720 STAR system, the time for the second deposition step is 125 seconds.

Between the nucleation step and the "high step coverage" step, there are transition steps during which gas flows are readjusted, but no $WF_6$ is flowed, and therefore no tungsten deposit is made. As indicated before, there as wide latitude in the transition, although it is preferable that time not be wasted, in the interest of high wafer throughput for a system.

After the second, "high step coverage" step, a third step in the preferred embodiment deposits tungsten in a manner to assure low film stress and high conductivity, highly desirable for interconnect applications. There are, again, transition steps without deposition between the second and the third steps.

In the third step, the flow of $WF_6$ is significantly reduced. Argon is increased, and hydrogen gas is increased as well, to provide deposition conditions conducive to low stress. It was found that under the particular conditions established, the reflectivity of the integral film proved adequate for subsequent purposes without inclusion of nitrogen in the process at any point. Reflectivity greater than 40% is consistently achieved, measured at the conditions specified above.

The third deposition step is performed at the same wafer temperature as the other two steps, that is 400° C. in the preferred embodiment. The total pressure is maintained between 30 and 100 Torr, preferably 30 Torr. The preferred gas flows are:
Argon: 2627 sccm
Hydrogen: 5733 sccm
$WF_6$: 38

In this third step, performed at low $WF_6$ flow, it is necessary the a gas distribution device such as the showerhead described above be used to maintain adequate uniformity of film thickness over the wafer coated. For this low-stress step, the showerheads in the 8720 STAR system are extended to a point preferably about 2.5 cm. from the wafer surface to be coated.

Under these conditions and for the Model 8720 STAR system, the time to provide the desired thickness of about 3600 Å is about 215 seconds.

After the third step, the integral universal film is finished, and non-dep steps are performed preparatory to removing processed wafers from the system, after which new, uncoated wafers are introduced for a new batch process.

Relative to the showerhead devices discussed above: These are distribution devices known in the art which provide mechanical distribution of gases injected into the system over the surface of a wafer. The use of a showerhead is known to influence coating parameters significantly, such as uniformity of deposit and deposition rate, as well as other parameters. There are several different sorts of showerhead devices in the art, and all of these devices are typically mixing chambers with a surface of at least the extent of the wafer to be coated, having a pattern of holes for introducing the coating gas mixture relatively evenly near the wafer surface to be coated. Typically the surface with holes for introducing the coating gas mixture is positioned parallel to the wafer surface to be coated, to avoid gradients due to varying distance.

In the preferred embodiment of the present invention, the showerhead is just such a device, and the device is adjustable to bring the distribution surface with the pattern of holes to within about one-quarter inch of the wafer surface, or to move the distribution surface of the showerhead far enough away from the wafer surface that the effect is as though there is no showerhead.

In the preferred embodiment of the present invention, the showerhead is extended to a distance of about 2.5 cm from the wafer surface to be coated for all three steps.

In a typical result of the overall process described above, the following parameters were measured for the overall film for one test wafer of six coated in the process of the preferred embodiment:
Total film thickness: 10328 Å
Resistivity: 86.86 $\mu\phi$/square
Uniformity: 2.26%
Stress: 7.5E+9 Dynes/cm$^2$ The step coverage is verified by SEM analysis, and shows voidless fill of 0.6$\mu$ contacts with aspect ratios of greater than 2.

In the process of the preferred embodiment, using the Genus 8720 STAR system, a gross throughput of 27 wafers per hour is typical.

Figure 2:
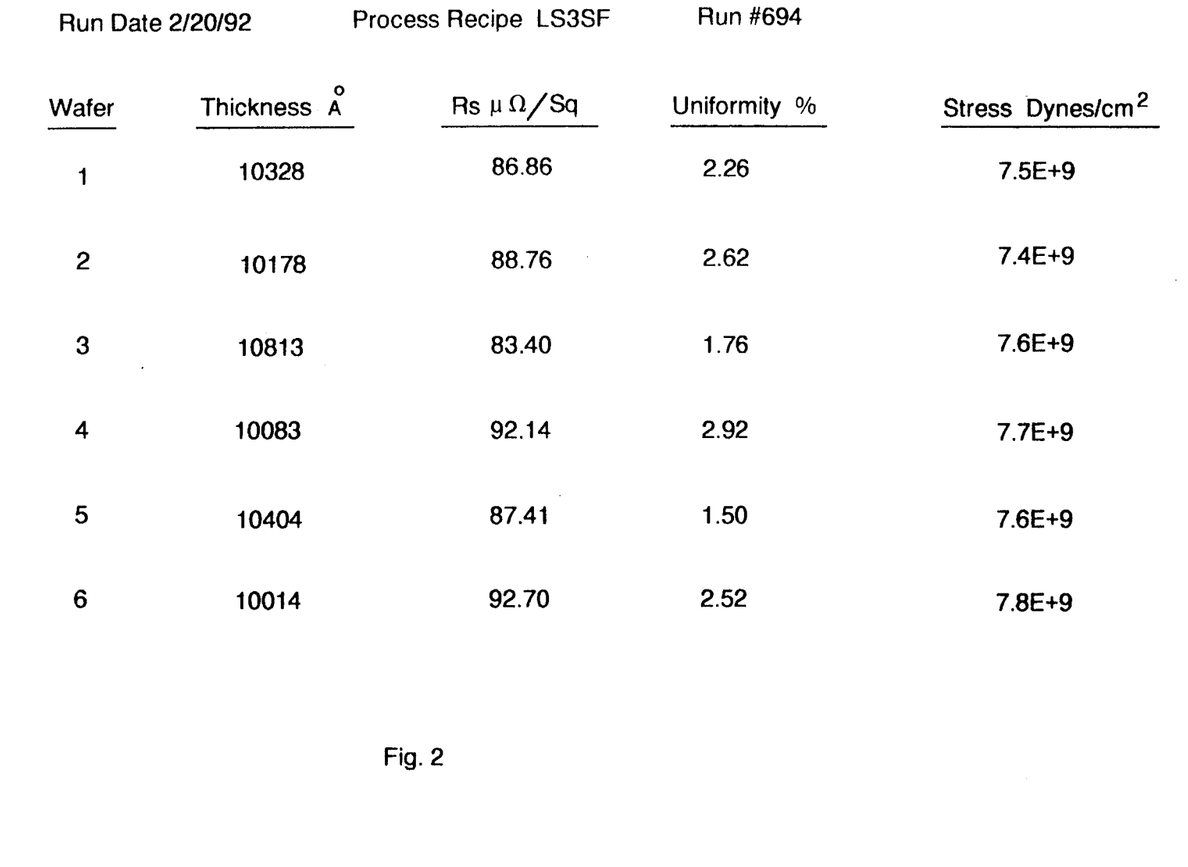
FIG. 2 is a table of overall film characteristics obtained for an integrated film in an embodiment of the present invention.

FIG. 2 is a table of measured results for a process recipe labeled LS3SF, which is the process described above as the preferred embodiment, and from which the measured results from one wafer are quoted. In FIG. 2 the measured results for all six wafers of an actual test run are compiled.

Figure 3:
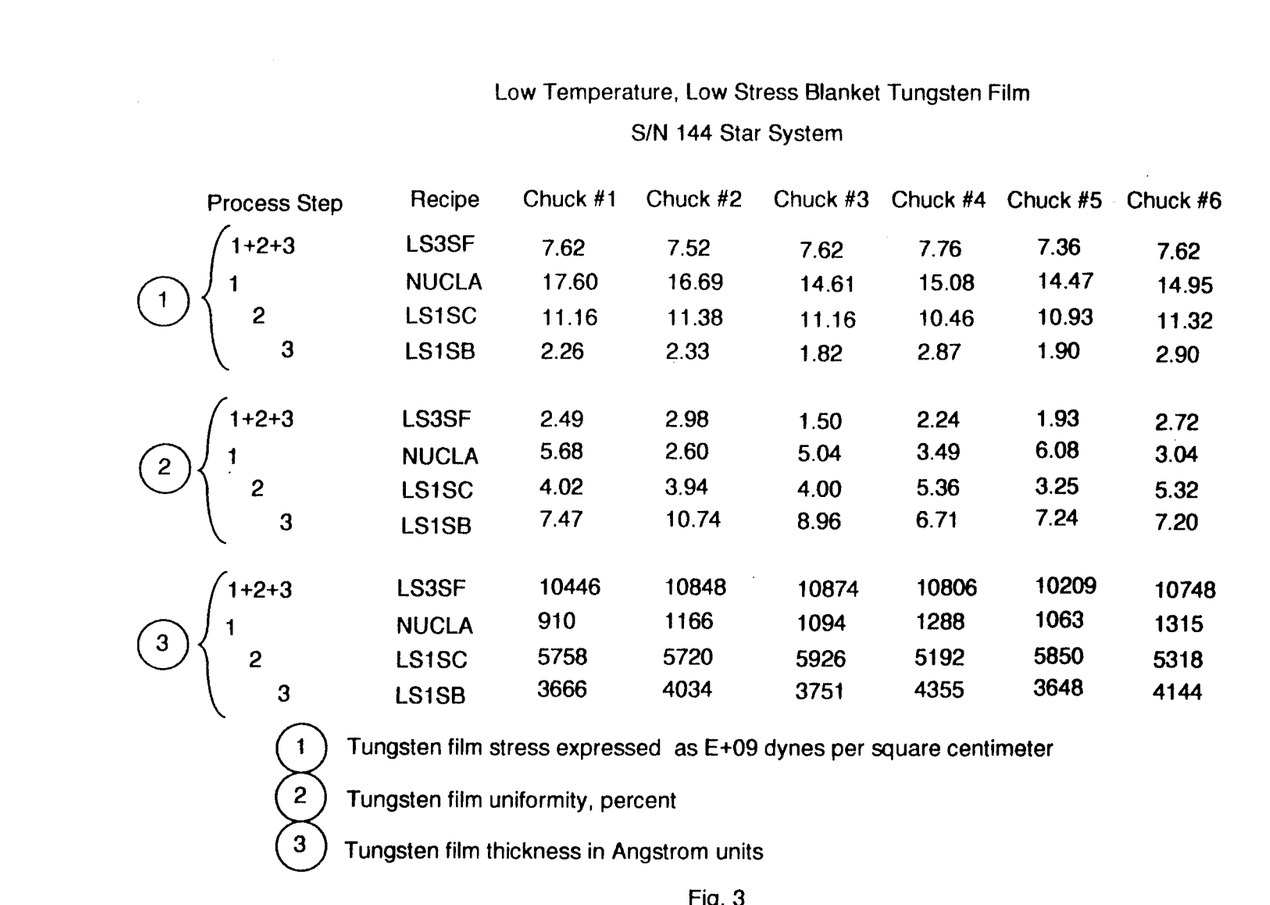
FIG. 3 is a table of film characteristics for sub-process films and for wafers coated by a complete process in an embodiment of the present invention.

FIG. 3 is a table showing the results of measurements made on test wafers upon which individual deposition steps were performed, and other wafers upon which the three-step process was also performed. The purpose being to compare the separate step effects with the total. In this case, recipe LS1SB is the process recipe for the "low-stress" step (step 3), process recipe LS1SC is the recipe for the "high step coverage" step (step 2), and NUCLA is the process recipe for the nucleation step.

Figure 4:
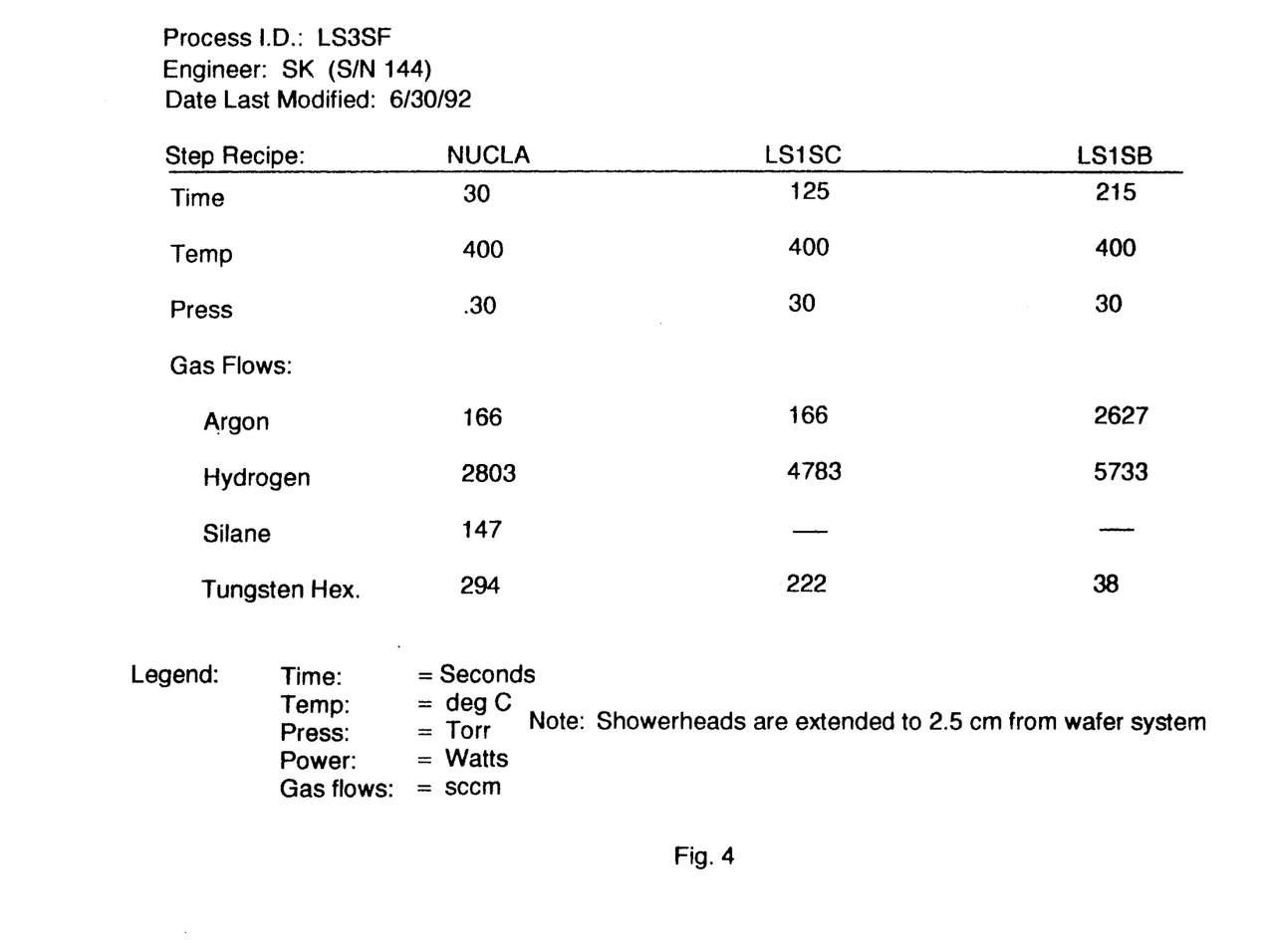
FIG. 4 is a process recipe for deposition for a preferred embodiment of the present invention.
Figure 5:
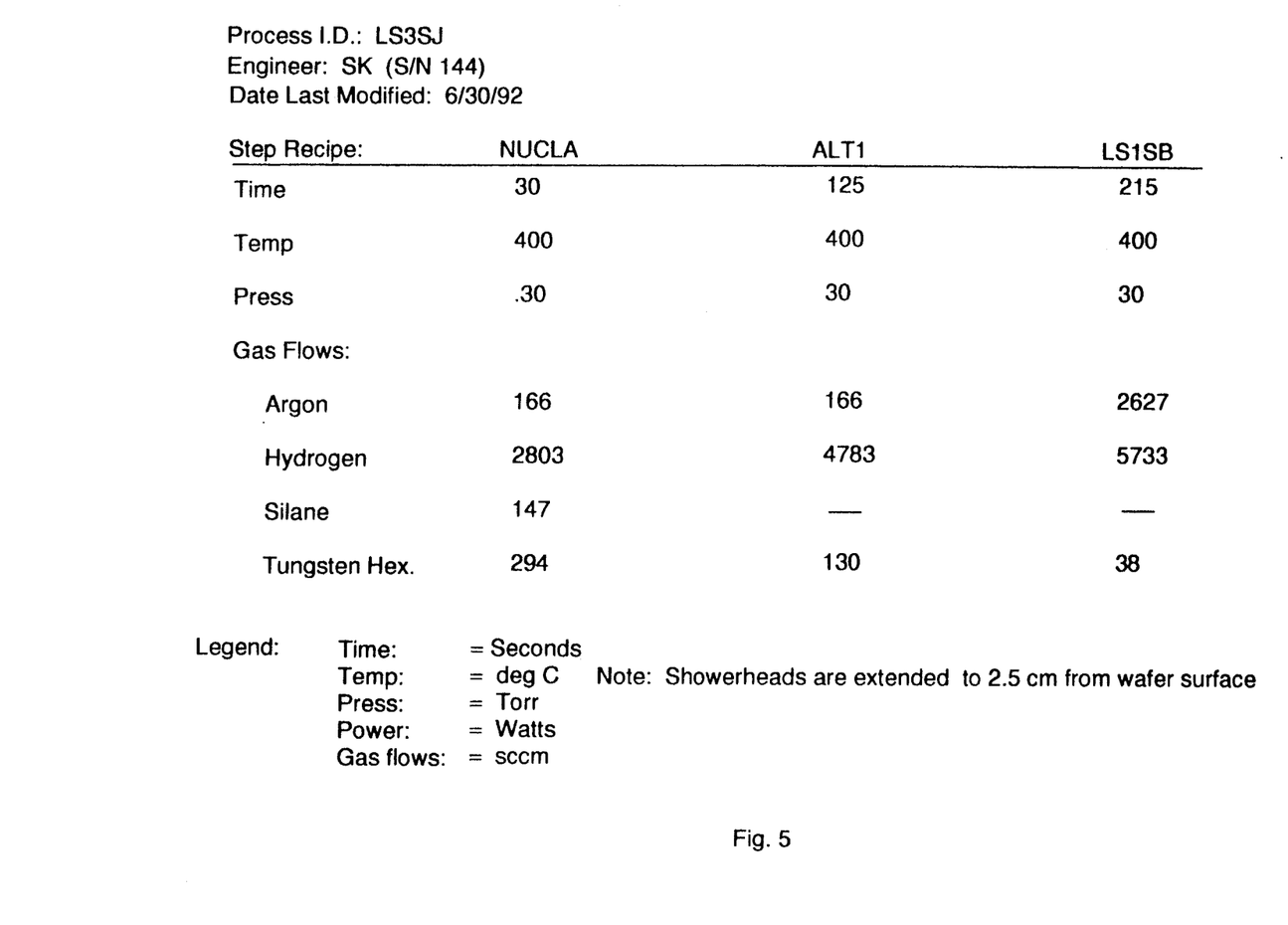
FIG. 5 is a process recipe for an alternative embodiment of the present invention.

FIG. 4 shows the process recipes for the overall three step process (LS3SF), and the constituent sub-processes NUCLA, LS1SC, and LS1SB in terms of time, temperature, pressure, various gas flows, and showerhead position, for the six chuck system in the preferred embodiment. FIGS. 5-8 show other overall and constituent subprocesses used and evaluated in establishing the present invention. For example, FIG. 5 shows a process similar to preferred process LS3SF, called LS3SJ, wherein the step coverage step, labeled ALT1, differs by a lower flow rate of tungsten hexafluoride.

Figure 6:
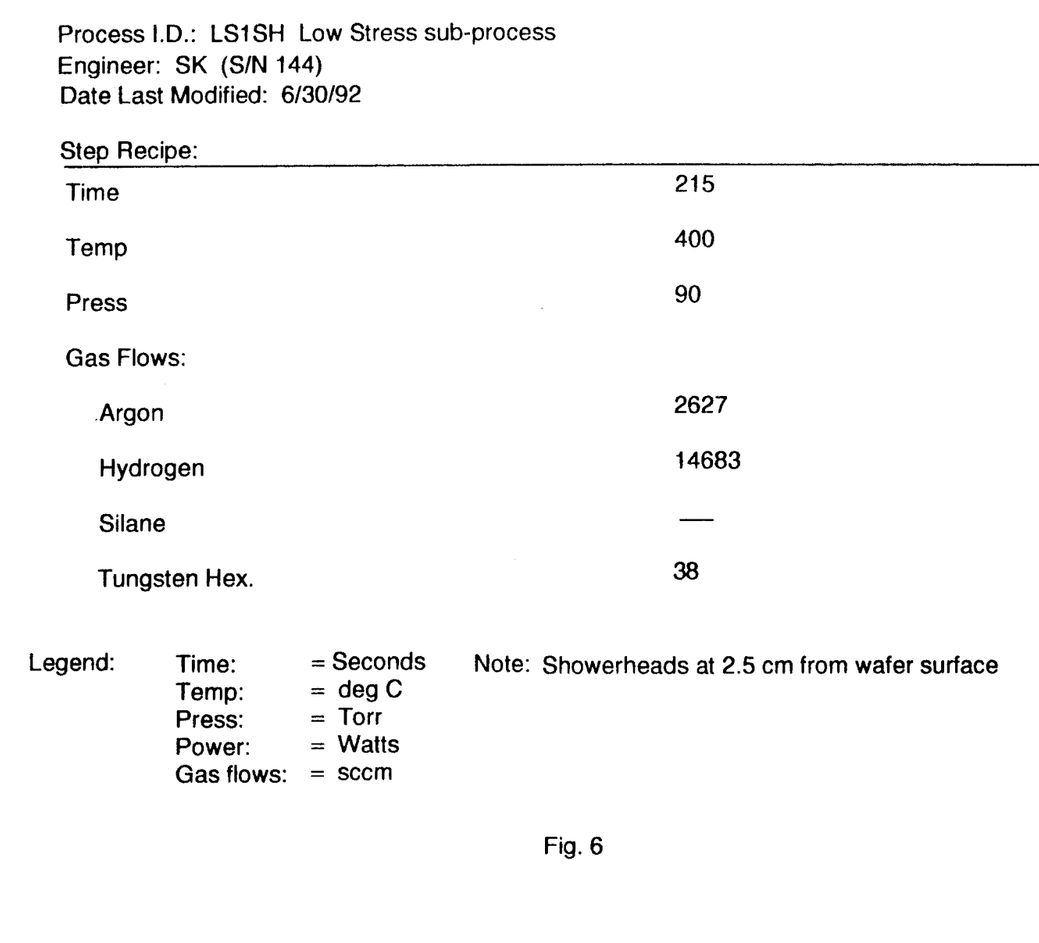
FIG. 6 is a recipe for a low stress sub-process for depositing a portion of an integrated film in a preferred embodiment of the present invention.

FIG. 6 shows an alternative low-stress step sub-process. In this particular alternative, the overall pressure is maintained at 90 Torr.

Figure 7:
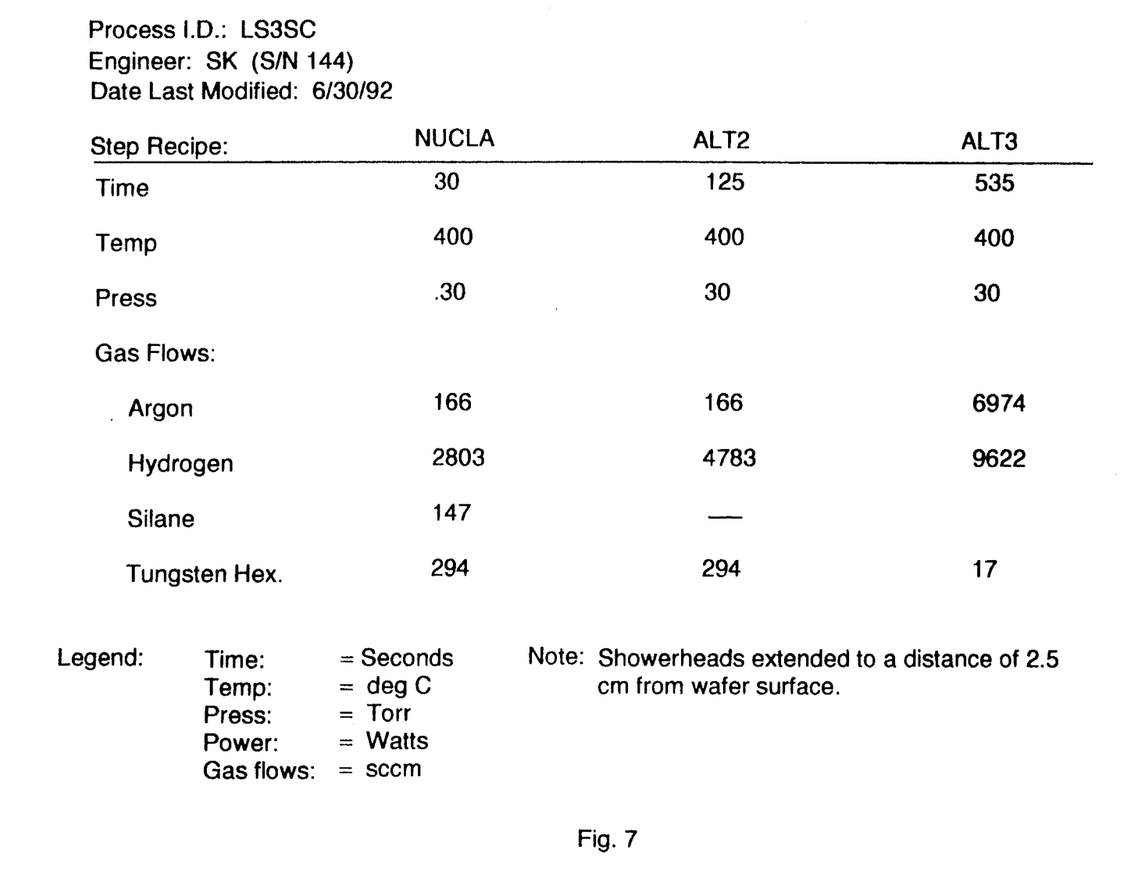
FIG. 7 is another alternative process according to the present invention.

FIG. 7 shows another overall integral process labeled LS3SC wherein the nucleation step of the preferred embodiment (NUCLA) is utilized, and wherein the high step coverage step has a slightly higher tungsten hex flow than in the preferred embodiment, and the low stress step differs from the preferred embodiment by a significantly higher argon and hydrogen flow, a lower flow rate of tungsten hex than in the preferred embodiment, and a longer time.

Figure 8:
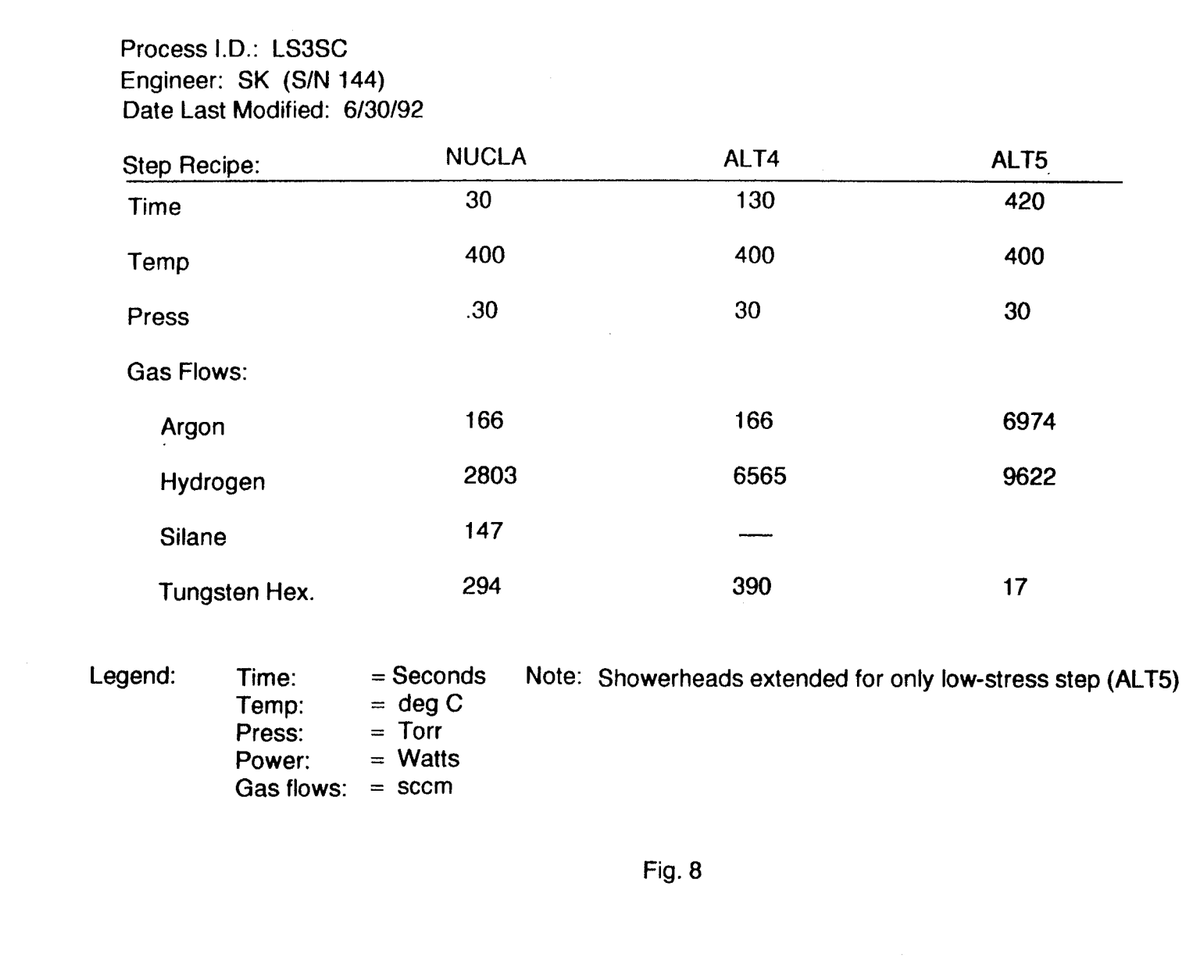
FIG. 8 is yet another alternative process according to the present invention.

FIG. 8 shows another alternative for an overall process according to the invention, with further variations in time and flow rates in the high step coverage and low stress steps. In FIG. 8 the showerheads are not extended for the nucleation and the high-step-coverage step.

Many other variations and evaluations were made to arrive at the process of the preferred embodiment. For example, the overall pressure was varied from about 250 millitorr to about 500 millitorr in the nucleation step, and from about 20 Torr to about 100 Torr in the high step coverage and low stress steps. The temperature was kept constant in each trial of an overall process, but tried at various temperatures in the range of about 350 degrees C. to 400 degrees C. It was found that the preferred results were at 400 degrees as opposed to lower temperatures. The temperature was not increased over 400 degrees C., as the goal was to invent a low temperature integral process, and there was no motivation to go to a higher temperature for the purposes of the invention. It is believed, however, that the process of the invention will work admirably at temperatures above 400 degrees C., and in some cases, temperatures as high as 440 degrees C. may be preferred.

In some embodiments not shown, the $WF_6$ flow for the low stress step was reduced as low as about 10 sccm and as high as about 50 sccm, but the best overall results were obtained at the conditions related for preferred process LS3SF, that is 38 sccm. Similar process windows were investigated in other steps and in the overall process.

It will be apparent to a worker with skill in the art that there are many alterations in the parameters of the invention that might be made without departing from the spirit and scope of the invention. Variations in time for the steps can be used to arrive at different overall thicknesses, for example, and also to tailor the overall stress, reflectivity, and other parameters of the integral film to meet specific requirements. It is emphasized, too, that the present invention recites preferred process conditions for a system processing six wafers in a batch process. For a single wafer, as some systems in the art process wafers one-at-a-time, the gas flows should be divided by six. The flows are also recited herein for a six inch wafer. For wafers of other sizes the gas flows need be adjusted accordingly according to wafer surface areas.

What is claimed is:

1. A method for depositing a blanket integrated film of tungsten by CVD from $WF_6$ reduced by $H_2$ on a surface to be coated of a semiconductor wafer, comprising the steps of:
    forming a first portion of the integrated film under conditions conducive to voidless via fill to fill any vias on the surface to be coated, the first portion deposited at a wafer temperature not exceeding 440° C., a total pressure of from about 20 Torr to 100 Torr, and a $WF_6$ flow of at least 0.15 sccm per square centimeter of wafer surface to be coated, the coating gases injected over the wafer surface through a gas distribution device at a distance no greater than about 5.0 cm;
    forming a second portion of the integrated film under conditions conducive to a low film stress, the second portion deposited at a wafer temperature not exceeding 440° C., a total pressure of from about 20 Torr to 100 Torr, and a $WF_6$ flow no more than 0.05 sccm per square centimeter of wafer surface, the coating gases injected over the wafer surface through the gas distribution device at a distance no greater than about 5.0 cm.

2. The method of claim 1 wherein said first portion is deposited without the use of said gas distribution device.

3. The method of claim 1 wherein each of said first and second film portions are deposited in the absence of nitrogen.

4. The method of claim 1 wherein the integrated film attains a thickness of at least 0.8 micron, of which at least half of the thickness is deposited as said first portion.

5. The method of claim 4 wherein 60% or more of the final film thickness is deposited as said first portion.

6. The method of claim 1 wherein said first portion is deposited at a temperature of about 400° C., a total pressure of about 30 Torr, and with a $WF_6$ flow of about 0.22 sccm per square centimeter of wafer surface, and said second portion is deposited at a temperature of about 400° C., a total pressure of about 30 Torr, and with a $WF_6$ flow of about 0.04 sccm per wafer.

7. The method of claim 1 further comprising an additional and prior nucleation step before depositing said first and said second film portions, said nucleation step comprising deposition of tungsten to a thickness of from about 500 to about 1000 Å at a temperature not exceeding 440° C. at a total pressure not exceeding 0.5 Torr, comprising a flow of $WF_6$ of at least 0.20 sccm per square centimeter of wafer surface, and a flow of $SiH_4$ at least one-fifth of the $WF_6$ flow.

8. A method for depositing a blanket integrated film of tungsten by CVD on a surface to be coated of a semiconductor wafer in the absence of nitrogen, comprising the steps of:
    placing said wafer to be coated on a support in a CVD chamber;
    heating said wafer to a temperature not exceeding 440° C.;
    depositing a first portion of said integrated film to a thickness of at least 50% of the total integrated film thickness by:
        flowing $WF_6$ onto the surface to be coated at a flow rate of at least 0.15 sccm per square centimeter of wafer surface;
        flowing hydrogen onto the surface to be coated in conjunction with flowing $WF_6$, and at a rate of at least ten times the $WF_6$ flow rate; and
        maintaining total pressure in the chamber of at least 25 Torr; and depositing a second portion of said integrated film by:
        flowing $WF_6$ onto the wafer at a flow rate of no more than about 0.05 sccm per square centimeter of wafer surface;
        flowing hydrogen onto the wafer in conjunction with flowing $WF_6$, and at a rate of at least one hundred times the $WF_6$ flow rate; and
        maintaining total pressure in the chamber of at least 25 Torr;

the coating gases injected onto the wafer surface through a gas distribution device at a distance no greater than about 3.8 cm.

9. The method of claim 8 wherein the temperature of the wafer to be coated is maintained at about 400° C. for deposition of both portions of the integrated film, the pressure is maintained at about 30 Torr for deposition of both portions of said integrated film, the flow of $WF_6$ is maintained at about 0.20 sccm per square centimeter of wafer surface for the deposition of said first portion of said integrated film, and the flow of $WF_6$ is maintained at about 0.04 sccm per square centimeter of wafer surface for deposition of the second portion of said integrated film.

10. A method for depositing a blanket integrated film of tungsten by CVD on a surface to be coated of a semiconductor wafer in the absence of nitrogen, comprising the steps of:
   placing said wafer to be coated on a support in a CVD chamber;
   heating said wafer to a temperature not exceeding 410° C.;
   depositing a nucleation layer at a total pressure not exceeding 0.5 Torr comprising steps of:
      flowing $WF_6$ onto the surface to be coated at a flow rate of at least 0.20 sccm per square centimeter of wafer surface;
      flowing hydrogen in said CVD chamber in conjunction with said flow of $WF_6$; and
      flowing $SiH_4$ in said chamber in conjunction with said flowing of $WF_6$ and hydrogen, and at a rate of at least one-fifth of said $WF_6$ flow;
   depositing a high-step-coverage portion of said integrated film to a thickness of at least 50% of the total integrated film thickness at a total pressure of from 20 Torr to 100 Torr comprising steps of:
      flowing $WF_6$ onto the surface to be coated at a flow rate of at least 0.15 sccm per square centimeter of wafer surface;
      flowing hydrogen onto the surface to be coated in conjunction with flowing $WF_6$; and
   depositing a low-stress portion of said integrated film at a total pressure of from 20 to 100 Torr comprising steps of:
      flowing $WF_6$ onto the surface to be coated at a flow rate of no more than about 0.05 sccm per square centimeter of wafer surface; and
      flowing hydrogen onto the surface to be coated in conjunction with flowing $WF_6$;
   the coating gases injected onto the wafer surface through a gas distribution device at a distance of no more than about 3.8 cm.

* * * * *